May 19, 1953 H. C. GOODRICH, JR 2,639,373
SIGNAL SEEKING RECEIVER
Filed May 26, 1948
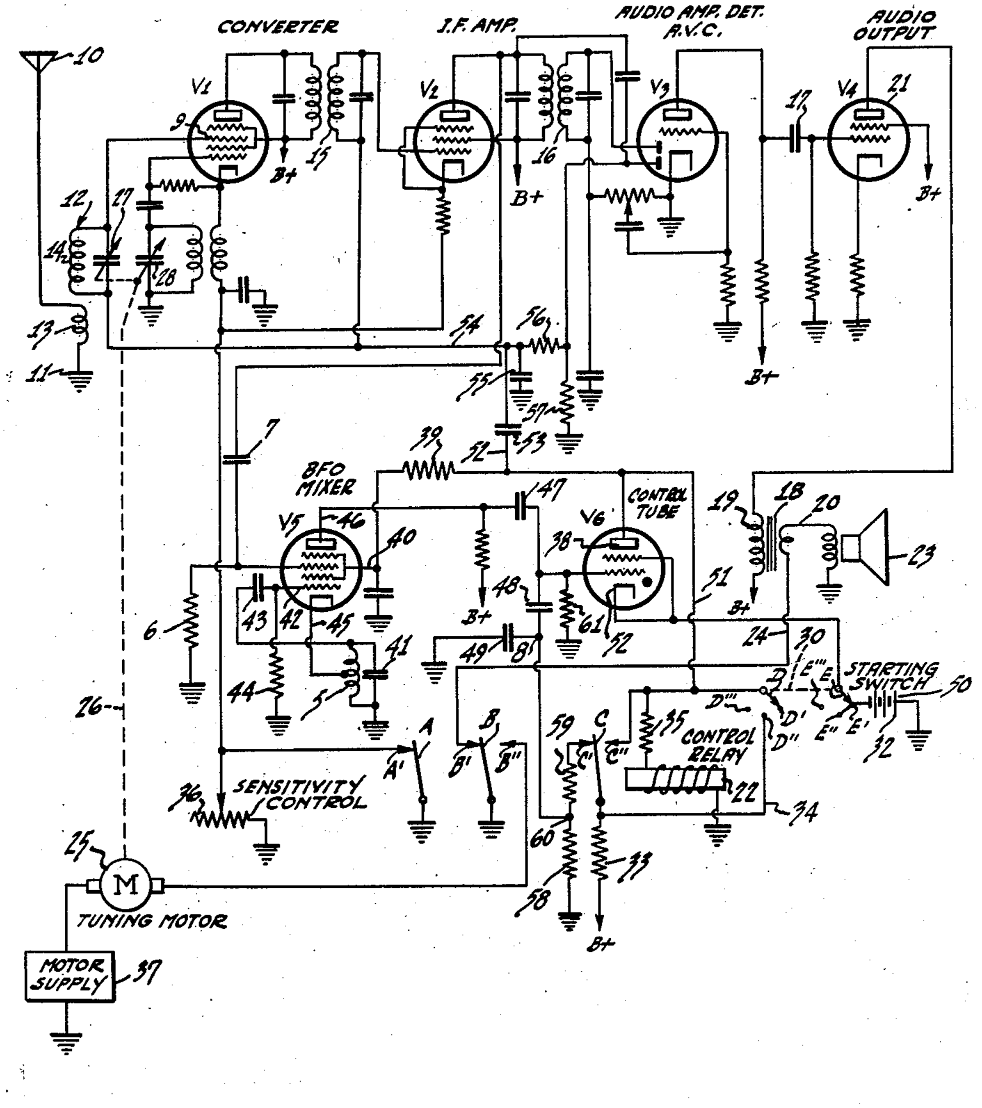
INVENTOR
HUNTER C. GOODRICH, JR.
BY Philip B. Cooper
ATTORNEY Patented May 19, 1953 2,639,373

UNITED STATES PATENT OFFICE 2,639,373

SIGNAL SEEKING RECEIVER

Hunter C. Goodrich, Jr., Collingswood, N. J., assignor to Radio Corporation of America, a corporation of Delaware Application May 26, 1948, Serial No. 29,267

8 Claims. (Cl. 250—20)

This invention pertains to a radio receiver and more particularly to a radio receiver of the signal seeking type, wherein the tuning element of the receiver is driven by a tuning motor during the tuning process, thereby causing the receiver tuner to scan the frequency spectrum until a station is automatically selected.

Ordinarily, in operation of signal seeking radio receivers, when it is desired to tune in a station, a tuning motor is started to initiate the tuning process to cause the receiver to scan a particular frequency spectrum. When a signal of sufficient strength is encountered, a portion of the received signal is applied to a control circuit which acts to remove the energy applied to the tuning motor, thereby causing the tuning operation to cease and permit the receiver to remain tuned to the particular received signal.

One of the problems heretofore encountered in providing a signal seeking superheterodyne radio receiver was that when the next station desired to be tuned in had a frequency allocation in close proximity to the station to which the receiver was tuned, it was necessary for the operator to "flick" the starting switch by a quick actuation or series of quick actuations to prevent overriding the desired station during the tuning operation. Further, the tuning problem was aggravated by the necessity of keeping the starting switch closed, at least, until the tuner had scanned beyond the effective control range of the previously tuned station. This "flicking" technique is undesirable since experience has taught that a certain amount of skill and experience is required for tuning in the stations which have frequency allocations relatively close to the station currently tuned in.

The present invention contemplates overcoming this objection, and it is, therefore, an object of the present invention to provide a novel circuit including a gaseous control tube to permit a single actuation of the starting switch to automatically stop the receiver on the next station having effective signal strength regardless of the proximity of its frequency allocation to the frequency of the currently tuned station.

It is a further object of the present invention to provide a signal seeking radio receiver which will automatically stop the tuning operation on the first received signal of adequate strength even though the starting switch is held in its actuated position.

It is a further object of the invention to provide a signal seeking radio receiver with a starting switch for initiating the signal seeking operation, said switch having an initial starting position, to stop the receiver on the first effective signal received regardless of the frequency allocation proximity to the previously received signal, said switch also having a continuous scanning position to continuously scan a band until the dial setting indicates the desired station is nearly reached, whereupon the starting switch may be released and the signal seeking function is completed automatically.

A further object of the invention is to provide a dual purpose starting switch having one position for automatically stopping the tuning operation on a station having a frequency allocation sufficiently close to the previous station that ordinarily a quick actuation, or "flicking" of the starting switch would be required, and a continuous scanning position of the starting switch for automatically stopping on a station having a frequency that would ordinarily not require a quick actuation, or "flicking" of the starting switch.

Another object of the invention is to provide a novel signal seeking circuit wherein a single actuation of the starting switch, of any duration, will produce a blanking pulse of a predetermined duration to disable the control circuit until the tuner has scanned beyond the effective control range of the previously tuned station, whereupon normal signal seeking action is automatically restored.

A further object of the invention is to provide a signal seeking tuner having novel circuit means for momentarily reducing the receiver gain to improve the muting function during the switching operation.

Another object of the invention is to provide a signal seeking radio receiver having novel circuit means for muting the receiver by reducing the radio frequency (R. F.) and intermediate or beat frequency (I. F.) gain during the switching operation upon deenergization of the control relay, thus preventing electrical transients created by the switching operation from causing an audible "thud" in the loudspeaker.

Further and other objects of the invention may be, and may become apparent, from a perusal of the disclosure herein. It is to be understood that while certain specific illustrations are presented, they are not to be considered as limitations except as defined by the spirit of the appended claims.

Referring to the drawings, the single figure shows a representative superheterodyne radio receiver circuit employing an antenna 10 and a ground connection 11, shown by conventional symbols, inductively coupled by antenna transformer 12, having a primary 13 and a secondary 14, to the signal grid 9 of converter tube V1. The output of converter tube V1 is coupled through the I. F. transformer 15 to the input of the I. F. amplifier tube V2. The output of I. F. amplifier V2 is coupled through the I. F. transformer 16 to audio tube V3 which is a multi-purpose tube, and as shown, acts as audio amplifier, detector and AVC rectifier. The amplified output of tube V3 is coupled through capacitor 17 to the input of audio output tube V4. The plate 21 of audio output tube V4 is connected to one end of the primary 19 of an output transformer 18.

The other end of primary winding 19 is connected to a source of positive voltage denoted by the symbol B+. One side of secondary winding 20 of audio output transformer 18 is connected to the speaker or electrical transducer 23, the other end of secondary winding 20 being connected through a relay contact B' and movable relay contact arm B to ground, completing the circuit to speaker 23, one side of which is also grounded.

Arm B together with other movable arms A and C form part of a control relay 22. A fixed contact A' cooperates with arm A. Arm B is shiftable between contact B' and another contact B''. Double throw contacts C' and C'' cooperate similarly with arm C. When the control relay 22 is deenergized contact sets A—A', B—B', and C—C' are closed, as shown in the drawings. Upon energization of control relay 22, contact set A—A' is opened, contact set B—B' is opened, and contact set B—B'' is closed, while contact set C—C' is opened and contact set C—C'' is closed.

To provide signal seeking operation for the superheterodyne radio receiver, a tuning motor 25 is connected by a shaft 26 to the tuner portion of the radio receiver indicated by variable condensers 27 and 28. While variable condensers are shown specifically, it is to be understood that the shaft may be connected to a permeability tuner or any form of tuner which is adaptable for use in conjunction with the tuning motor.

A starting switch 30, which is of the manually operable type, is indicated by the dotted line connecting contact arms D and E, which are movable from the normal rest position, wherein contact arm D engages a fixed contact D' and contact arm E engages a fixed contact E', to the initial starting position, wherein arms D and E are shifted respectively to contacts D'' and E''. A third position of the starting switch for continuous scanning is provided by stationary contacts D''' and E'''. The starting switch is of a type wherein a light pressure on the connected movable arms D and E will shift said movable arms from the first, or "rest position," to the second or "initial starting position," and a greater pressure on the starting switch will further advance the movable arms D and E to the third or "continuous scanning position."

A mixer tube V5, which is of the converter type, is operated as a beat frequency oscillator (BFO). This tube as well as a gaseous control tube V6 or thyratron, have cathodes heated to permit instant operation thereof, but they are normally inoperative when the control tube relay 22 is in the deenergized position as shown in the drawings, indicating that the receiver is in playing position.

Upon movement of the starting switch to the second or "initial starting position," control relay 22 is energized by the flow of current from the B+ supply, through resistor 33, lead 34, contact set D—D'', resistor 35, and the winding of control relay 22 to ground. Upon energization of the control relay, contact set A—A' opens, placing a sensitivity control 36 in series with the cathode returns to ground of tubes V1 and V2. Also contact set B—B' is opened, breaking the circuit from output transformer secondary 20 to speaker 23 and muting the radio receiver. The closure of contact set B—B'' completes the circuit between tuning motor 25 and motor supply 37, energizing the tuning motor and causing the receiver to scan the frequency spectrum by virtue of the movement of variable capacitors 27 and 28. The closure of contact set C—C'' completes a current path from the B+ supply through resistor 33, contact set C—C'', resistor 35, and the winding of control relay 22 to ground, maintaining energization of the control relay when the starting switch 30 has been released to its "rest position."

The closure of contact set C—C'' applies that portion of the B+ voltage that exists across resistor 35 and control relay winding 22, to the plate 38 of control tube V6, placing said tube in an operable condition. A portion of the voltage on plate 38 of tube V6, is applied through resistor 39 to the screen 40 of BFO mixer tube V5, causing the BFO mixer tube also to become operative. When the receiver tuned frequency approaches the frequency of a signal of adequate strength, the resulting I. F. signal on the plate of V2 is impressed through capacitor 7 on the signal grid of the BFO mixer V5. Resistor 6 provides a D. C. grid return to ground. Upon application of voltage to the screen 40 of BFO mixer tube V5, the oscillator section of V5 comprising screen 40, oscillator grid 42, and cathode 45, oscillates at a frequency determined by the values of inductor 5 and capacitor 41. The BFO frequency is made equal to the nominal receiver I. F. frequency. Capacitor 43 couples oscillator grid 42 to the tank circuit composed of inductor 5 and capacitor 41. Resistor 44 serves as grid leak to the oscillator grid 42.

The application of an I. F. signal to the signal grid of V5 causes the BFO to effect a heterodyne action, and a frequency component equal to the difference between the frequency of I. F. signal and the frequency generated in the oscillator section of V5 appears on the plate 46 of tube V5. This difference, or beat frequency signal, is coupled by capacitor 47 to the control grid of the tube V6. In either the resting or initial starting position of starting switch 30, a cathode bias voltage from voltage source 50 is applied to the cathode 52 of tube V6.

Tube V6 is biased beyond cut-off so that it will not conduct or fire until a positive signal of a certain amplitude is applied to the control grid. Until the receiver tuned frequency has very closely approached the frequency of the signal to be received, the beat frequency appearing on the plate 46 of tube V5 will be relatively high. Since V5 has a relatively high plate resistance, a high beat frequency will be largely by-passed to ground through the series path of capacitors 47, 48, and 49, and will not produce sufficient signal amplitude on control grid of V6 to cause firing. The series capacitance of capacitors 47, 48, and 49 in comparison with the plate resistance of V5 is of such a value that only relatively low beat frequencies, corresponding to accurate receiver tuning for the particular signal will produce sufficient voltage at the positive peak of the beat frequency signal on the control grid of V6 to cause V6 to fire.

When the signal has been accurately tuned in to cause control tube V6 to fire, most of the current which formerly flowed through resistor 35 in the winding of control relay 22 to ground, is shunted through lead 51 and plate 38, cathode 52, and voltage source 50 to ground. Since the total current through contacts C—C'' is limited by the presence of resistor 33, the reduction in current flowing through the winding of control relay 22 causes the relay to shift to the deenergized position. Upon deenergization of the relay the opening of contact set C—C'' removes the voltage from plate 38 of control tube V6, and from screen 40 of the BFO mixer tube V5, making both of these tubes inoperative, and also breaks the current flow through the winding of control relay 22.

The opening of contact set B—B'' deenergizes the tuning motor 25, leaving the receiver properly tuned to the particular actuating signal. The closure of contact set B—B' completes the circuit between the output transformer secondary winding 20 and the speaker 23. The closing of contact set A—A' short circuits the resistance introduced by sensitivity control 36 in the cathode returns of V1 and V2, restoring the receiver to full sensitivity.

At the instant the control tube V6 fires, the voltage on plate 38 of tube V6 falls suddenly as a result of the plate current of V6 passing through resistor 33. Capacitor 53 is connected from the plate 38 of V6 to the AVC line 54 supplying AVC voltage to the control grids of the converter V1 and the I. F. amplifier V2. The sudden drop in voltage on plate 38 of V6 at the instance of firing, causes a momentary negative pulse on AVC line 54, as capacitor 53 discharges through resistors 56 and 57. This momentarily lowers the gain of tubes V1 and V2 making the receiver momentarily insensitive at that instant to any electrical transients produced by control relay 22 as its contacts move from the energized to the deenergized position. Upon completion of discharge of capacitor 53, the normal gain of the receiver is restored. The purpose of above said negative pulse is to prevent any electrical transients caused by the switching of the control relay from producing an audible "thud" in the speaker, and to cause the received signal to become audible somewhat gradually rather than abruptly.

When the starting switch is closed and the control relay is energized, the opening of contact set C—C' removes that portion of the B+ voltage formerly applied to terminal 60, which is connected to the junction terminal 8 of capacitors 48 and 49. Capacitor 49 then discharges through resistor 58, and capacitor 48 discharges through resistor 58 and grid resistor 61. The discharge current of capacitor 48 flowing through resistor 61 causes a momentary negative voltage pulse on the control grid of tube V6, which pulse is an increased negative bias on the control grid of V6 and prevents the beat frequency signal developed by the signal being received at the time the starting switch is closed, from causing the control tube V6 to fire. Resistor 61 is of such a value that the time constant of the control grid circuit of V6 causes the negative pulse to persist only for the length of time required for the receiver to scan out of the range of control of the previous incoming signal. The grid bias on tube V6 is thus restored to its normal value before the receiver has scanned to the next frequency channel on which a signal might be received.

It is to be noted that when the starting switch is in the "initial start position," that is when contact sets D—D'' and E—E'' are closed, the reception of a signal of sufficient strength to fire control tube V6 will cause control relay 22 to be deenergized as a result of the shunting effect of the plate circuit of V6. Thus when the starting switch has been moved to the "initial starting portion," the receiver will automatically stop on the next signal of adequate strength regardless of whether or not the starting switch has been released to the "rest position" at the time the signal is encountered. This prevents the receiver from skipping any effective signal encountered before the operator has released the starting switch.

When the operator wishes to scan to a specific frequency he places the starting switch in the "continuous scanning position," that is with contact sets D—D''' and E—E''' closed, which opens the cathode circuit of control tube V6, and prevents any unwanted signals from prematurely stopping the scanning action. When the desired frequency is approached, as observed on the tuning dial, the starting switch may be released to permit said switch to restore to the "rest position," and the receiver will then stop automatically on the next signal received.

From the foregoing, it will be seen that the starting switch is essentially dual purpose in that an initial starting position of the starting switch is provided so that once the starting switch is actuated to its initial starting position, the provision of the blanking pulse permits the tuner to move beyond the range of the currently tuned signal, and the thyratron contact circuit permits the first signal received of effective strength to cause the tuning operation to cease, even though the starting switch is held in the initial starting position by the operator. Consequently, under the conditions, it will be impossible for the tuner to over-ride the first effective signal received, due to the operator holding the switch in the initial starting position too long. Therefore, regardless of proximity of frequency allocations, the first new signal of effective strength will cause the tuning operation to cease.

The continuous scanning position of the dual purpose starting switch permits the tuner to override all signals until the switch is released, thereafter, the tuner will cease operating on receipt of the first signal of effective strength.

A dual muting of the receiver is provided in that a momentary muting circuit momentarily reduces the receiver gain during the control tube operation to permit the new signal to increase at such a rate as to eliminate a "thud" in the speaker, while another muting function is also performed to totally disable the speaker during energization of the tuning motor.

While specific circuits, and arrangement of parts, have been shown to illustrate the invention, it is to be understood that changes and modifications may be made therein without departing from the spirit of the invention as defined by the appended claims.

What is claimed is:

1. In a radio receiver of the heterodyne type including at least a frequency converter stage having at least an anode, a cathode, and a control grid and an intermediate frequency amplifier stage having at least an anode, a cathode, and a control grid connected in signal transfer relationship, the combination including rectifier means coupled to the output of said intermediate frequency amplifier for deriving a biasing voltage from an intermediate frequency signal, an automatic voltage control line connected in circuit between said rectifier and the control grids of said converter stage and said amplifier stage; signal tuning elements connected to said converter stage, a scanning system causing said tuning elements to scan a predetermined frequency range, control circuit elements connected in said scanning system to terminate the scanning in response to the reception of a signal of predetermined intensity, and capacitive means coupling said control circuit to said automatic voltage control line whereby actuation of said control elements applies a momentary negative pulse on said control line to lower the gain of said receiver.

2. The combination as defined by claim 1, wherein said control circuit elements include a gaseous tube and said capacitive means couples the anode of said tube to said automatic voltage control line.

3. In a signal seeking radio receiver system the combination comprising tuning means for said receiver, scanning means causing said tuning means to scan the tuning frequency spectrum until a station is automatically selected, and control means for said scanning means including a gaseous discharge tube having at least an anode, a grid and a cathode, relay means connected in circuit with said cathode and anode for actuating said scanning means, a resistor and capacitor connected in shunt between said grid and cathode, and switch means selectively applying a source of direct potential across said capacitor during the normal reception period of said receiver, said switch means being actuated by said relay means upon initiation of said scanning means whereby said source is disconnected from said capacitor and said capacitor discharges through said resistor temporarily impressing a negative voltage pulse on said grid to maintain said tube non-conductive within the period required for said tuning means to scan away from the signal being received.

4. In a signal seeking radio receiver system the combination comprising tuning means for said receiver, scanning means causing said tuning means to scan the tuning frequency spectrum until a station is automatically selected, a starting switch for initiating operation of said scanning means upon actuation thereof from resting position to initial starting position, and control means for causing said tuner to stop on the first received signal of predetermined strength when said starting switch is in either the resting position or the initial starting position, said control means including a control tube having an input circuit actuated in response to signals of predetermined strength, a control relay energized by said starting switch to initiate said scanning means, and a contact set on said relay to hold the relay in an energized position, said control tube being connected in parallel with said relay to provide a low impedance path for the energizing current of said relay whereby said relay is de-energized in response to actuation of said control tube at either the resting or initial starting position of the starting switch.

5. A system as defined in claim 4, wherein continuous scanning contacts are provided for said starting switch, and said control tube is prevented from responding to said signals in the continuous scanning position of said switch.

6. A system as defined in claim 4, wherein receiver sensitivity control means is provided, and said control relay is provided with contacts which operate to connect said control means in the energized relay position and to reduce the gain of said receiver, whereby only signals of a predetermined strength cause the tuner to stop.

7. A system as defined in claim 4, including signal muting means, and contacts on said control relay to actuate said muting means in the energized position.

8. A system as defined in claim 4, wherein a beat frequency oscillator is provided, the output signal of said beat frequency oscillator being of a low frequency when the signal of adequate strength is properly tuned, and the input circuit of the control tube comprises a capacity voltage divider wherein the series capacitance of the voltage divider is of such a value that only relatively low beat frequencies corresponding to accurate receiver tuning provides sufficient voltage to actuate the tube.

HUNTER C. GOODRICH, Jr.

References Cited in the file of this patent

UNITED STATES PATENTS

| Number | Name | Date |
|---|---|---|
| 2,035,176 | McLennan | Mar. 24, 1936 |
| 2,177,713 | Granqvist | Oct. 31, 1939 |
| 2,224,224 | Hallam | Dec. 10, 1940 |
| 2,304,871 | Andrews | Dec. 15, 1942 |
| 2,326,737 | Andrews | Aug. 17, 1943 |
| 2,387,544 | Usselman | Oct. 23, 1945 |
| 2,426,580 | O'Brien | Aug. 26, 1947 |
| 2,525,442 | Bischoff | Oct. 10, 1950 |